United States Patent [19]

Shinbara

[11] Patent Number: 4,547,752
[45] Date of Patent: Oct. 15, 1985

[54] AMPLITUDE MODULATOR WITH THREE DIFFERENTIAL TRANSISTOR PAIRS

[75] Inventor: Seitaro Shinbara, Yokohama, Japan

[73] Assignee: Tokyo Shibaura Denki Kabushiki Kaisha, Japan

[21] Appl. No.: 480,005

[22] Filed: Mar. 29, 1983

[30] Foreign Application Priority Data

Mar. 31, 1982 [JP] Japan .................................. 58-53481

[51] Int. Cl.$^4$ ............................................. H03C 1/00
[52] U.S. Cl. ................................... 332/31 T; 332/44; 455/108
[58] Field of Search ...................... 332/31 T, 40, 43 B, 332/44, 48; 330/10, 252; 455/108, 109

[56] References Cited

U.S. PATENT DOCUMENTS

| 3,550,040 | 12/1970 | Sinusas | 332/44 |
| 3,974,460 | 8/1976 | Hongu et al. | 332/31 |
| 4,310,810 | 1/1982 | Toyomura et al. | 332/31 T |

FOREIGN PATENT DOCUMENTS 3038995 10/1980 Netherlands.

OTHER PUBLICATIONS

Rohde, "Performance Capability of Active Mixers" Wescon Conference Record, vol. 25, Sept., 1981, El Segundo, CA.
Bilotti, "Applications of a Monolithic Analog Multiplier," IEEE Journal of Solid-State Circuits, vol. SC-3, No. 4, Dec. 1968.

Primary Examiner—Eugene R. LaRoche
Assistant Examiner—Robert J. Pascal
Attorney, Agent, or Firm—Finnegan, Henderson, Farabow, Garrett & Dunner

[57] ABSTRACT

An amplitude modulator is disclosed which has first and second differential pairs of transistors whose bases are supplied with a carrier signal, and a third differential pair of transistors whose collectors are respectively connected to the common emitters of the first and second differential pairs of transistors and of which one transistor is supplied at a base with a modulating signal. The emitters of the first differential pair of transistors are connected together through corresponding resistors. The collectors of two transistors which are included in the first and second differential pair of transistors and of which the bases are connected together and further connected to a load resistor.

3 Claims, 1 Drawing Figure

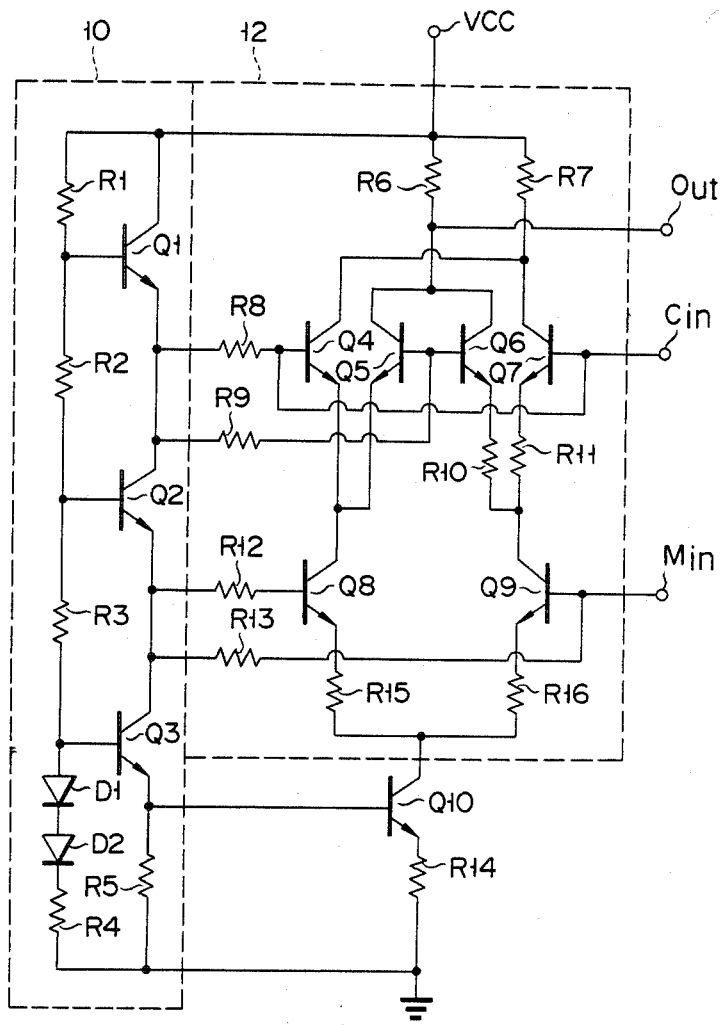

AMPLITUDE MODULATOR WITH THREE DIFFERENTIAL TRANSISTOR PAIRS

BACKGROUND OF THE INVENTION

This invention relates to an amplitude modulator, and, more particularly, to an amplitude modulator adapted for integration.

An amplitude modulator has been provided which modulates the amplitude of an amplified output signal by supplying a modulating signal to the base or collector terminal of a transistor. Difficulties have appeared in that a modulating signal leaks to the amplified output from the transistor, giving rise to fluctuations in the reference level (zero level) of the amplified output. To avoid this undesirable possibility, an output signal from the transistors has been drawn out through a transformer. Thus, the conventional amplitude modulator involving a transformer is not adapted for integration. Further, such a conventional amplitude modulator which produces a modulated signal by utilizing the diode characteristic between the base and emitter of a transistor fails to indicate a high linearity of modulation factor with respect to an amplitude of the modulating signal.

An amplitude modulator using a double balanced analog multiplier may be cited as one type which does not employ a transformer, as disclosed in "Applications of a Monolithic Analog Multiplier" by Alberto Bilotti (FIG. 2), IEEE Journal of Solid-State Circuits, December, 1968, pp. 373 to 380. This proposed double balanced analog multiplier has three differential pairs of transistors. The common emitters of the first and second differential pairs are respectively connected to the collectors of the third differential pair of transistors. The first and second pairs are supplied with a first differential input, and the third pair is supplied with a second differential input. The collectors of the first pair are connected respectively to the collectors of the second pair performing the opposite phase operation, and also to the output terminal.

With the above-mentioned circuit arrangement, a product of the first and second inputs appears at the output terminal. Namely, this circuit acts as a double side band (DSB) type amplitude modulator. With the DSB system, a carrier component does not appear, making it necessary to supply a carrier on the demodulator. Therefore, the DSB system is not adapted for general applications.

SUMMARY OF THE INVENTION

It is accordingly the object of this invention to provide an amplitude modulator adapted for integration which prevents a modulation signal from appearing in a modulated output and assures a high linearity of modulation factor.

To attain the above-mentioned object, this invention provides an amplitude modulator which comprises first and second differential pairs of transistors whose bases are supplied with a carrier signal, first and second resistors respectively connected to the emitters of the first differential pair of transistors, a third differential pair of transistors of which one transistor is supplied at a base with a modulating signal, and whose collectors are connected to the node of the first and second resistors and the emitters of the second differential pair of transistors, a current source connected to the emitters of the third differential pair of transistors, and a load resistor connected to the collectors of those two transistors selected from the first and second differential pair of transistors which perform the same phase operation.

With an amplitude modulator embodying this invention, the leaking component of a modulating signal is divided into two parts having opposite phases by the third differential pair of transistors, and later extinguished by the common collector of the first and second differential pair of transistors. Therefore, the leaking component of a modulating signal does not appear in an modulated output.

BRIEF DESCRIPTION OF THE DRAWING

This FIGURE shows a circuit arrangement of an amplitude modulator embodying this invention.

DETAILED DESCRIPTION OF THE PREFERRED EMBODIMENT

Description will now be given with reference to the accompanying drawing of an amplitude modulator embodying this invention. A bias circuit 10 is connected between a power supply terminal VCC and a ground terminal. The bias circuit 10 is formed of resistors R1 to R5, diodes D1, D2, and NPN transistors Q1 to Q3. Resistors R1, R2, R3, diodes D1, D2 and resistor R4 are connected in series between the power supply terminal VCC and ground. The node of the resistors R1, R2 is connected to the base of the transistor Q1. The node of the resistors R2, R3 is connected to the base of the transistor Q2. The node of the resistor R3 and diode D1 is connected to the base of the transistor Q3. Transistors Q1, Q2, Q3, and resistor R5 are connected in series between the power supply terminal VCC and ground. A double balanced circuit 12 has three differential pairs of transistors Q6-Q7, Q4-Q5, Q8-Q9. The collectors of the NPN transistors Q5, Q6 are connected to the power supply terminal VCC through a load resistor R6. The collectors of the NPN transistors Q4, Q7 are connected to the power supply terminal VCC through a load resistor R7. The load resistors R6, R7 are chosen to have the same resistance. The emitter of the transistor Q1 is connected to the bases of the transistors Q4, Q7 through a resistor R8, and also to the bases of the transistors Q5, Q6 through a resistor R9. The emitters of the transistors Q6, Q7 are connected together through resistors R10, R11. The resistors R10, R11 are chosen to have the same resistance, which is set at a far higher value than the emitter resistance of 1/gm (gm: mutual conductance) of the transistors Q6, Q7. The collector of the NPN transistor Q8 is connected to the common emitter of the transistors Q4, Q5. The collector of the NPN transistor Q9 is connected to the node of the resistors R10, R11. The emitter of the transistor Q2 is connected to the bases of the transistors Q8, Q9 through the corresponding resistors R12, R13. The emitters of the transistors Q8, Q9 are connected together through resistors R15, R16. The resistors R15, R16 are chosen to have the same resistance. The base of the transistor Q9 is connected to the modulating signal input terminal $M_{in}$. The bases of the transistors Q4, Q7 are connected to the carrier input terminal $C_{in}$. A modulated output terminal Out is connected to the common collector of the transistors Q5, Q6. The collector of the NPN transistor Q10 is connected to the node of the resistors R15, R16. The emitter of the transistor Q10 is grounded through a resistor R14. The emitter of the transistor Q3 is connected to the base of the transistor Q10.

Description will now be given of the operation of the amplitude modulator embodying this invention. The collector current IO of the transistor Q10 is rendered constant. The transistor Q10 acts as a constant current source. The constant current IO is divided into two components by the transistors Q8, Q9. The emitters of the transistors Q8, Q9 are jointly connected. The emitter of the transistor Q2 acting as a base bias source has a low impedance. Consequently a modulating signal A cos $\omega_1 t$ is differentially amplified by the transistors Q8, Q9. The collector currents I1, I2 of the transistors Q8, Q9 are expressed as follows:

$$I1 = IO/2 + (A/R15)\cos\omega_1 t \quad (1)$$

$$I2 = IO/2 - (A/R16)\cos\omega_1 t \quad (2)$$

The collector current I1 is divided by the transistors Q4, Q5. The collector current I2 is divided by the transistors Q6, Q7. The transistors Q4-Q5, and Q6-Q7 differentially amplify a carrier signal B cos $\omega_0 t$. With the transistors Q4, Q5, a carrier signal is subjected to amplitude modulation by the collector current I1 of the transistor Q8. The collector currents I3, I4 of the transistors Q4, Q5 are expressed as follows:

$$I3 = I1/2 + (I1/2VT)B\cos\omega_0 t \quad (3)$$

$$I4 = I1/2 - (I1/2VT)B\cos\omega_0 t \quad (4)$$

where
VT: kt/q.
k: Boltzmann constant
q: unit charge

With the transistors Q6, Q7, the resistors R10, R11 have a higher resistance than the emitter resistance, thus preventing a carrier signal from being subjected to amplitude modulation. The collector currents I5, I6 of the transistors Q6, Q7 are expressed as follows:

$$I5 = I2/2 - (B/R10)\cos\omega_0 t \quad (5)$$

$$I6 = I2/2 + (B/R11)\cos\omega_0 t \quad (6)$$

Of the two pairs of transistors, the transistors Q5, Q6 perform the same phase operation. The sum of the collector currents of the transistors Q5, Q6 is emitted from the output terminal Out. Consequently, a modulated output Iout is expressed as follows:

$$\begin{aligned}
Iout &= I4 + I5 \quad (7)\\
&= I1/2 - (I1/2VT)B\cos\omega_0 t\\
&\quad + I2/2 - (B/R10)\cos\omega_0 t\\
&= (1/2)\{IO/2 + (A/R15)\cos\omega_1 t\}\\
&\quad - (B/2VT)\cos\omega_0 t\{IO/2 + (A/R15)\cos\omega_1 t\}\\
&\quad + (1/2)\{IO/2 - (A/R16)\cos\omega_1 t\}\\
&\quad - (B/R10)\cos\omega_0 t\\
&= IO/2 - \left\{\left(\frac{B\cdot IO}{4VT}\right) + \left(\frac{B}{R10}\right)\right\}\cos\omega_0 t\\
&\quad - \left(\frac{A\cdot B}{2VT\cdot R15}\right)\cos\omega_0 t \cos\omega_1 t
\end{aligned}$$

The second term of the right side of the above equation (7) represents a carrier component, and the third term thereof denotes a side band component. With the amplitude modulator of this invention, it will be seen from the above equation (7) that the modulating signal cos $\omega_1 t$ appearing in the collector currents of the transistors Q8, Q9 is finally cancelled and does not appear in the modulated output. Consequently, the reference level of the modulated output does not change. A signal obtained by modulating the amplitude of the carrier signal cos $\omega_0 t$ by the amplitude of the modulating signal cos $\omega_1 t$ is emitted from the modulated output terminal Out. In this embodiment, the modulation factor $M_A$ is expressed as follows:

$$M_A = \frac{\frac{A\cdot B}{2VT\cdot R15}}{\frac{B\cdot IO}{4VT} + \frac{B}{R10}} = \frac{\frac{A}{2VT\cdot R15}}{\frac{IO}{4VT} + \frac{1}{R10}} \quad (8)$$

The modulation factor $M_A$ is not dependent on the amplitude B of the carrier. Where R10, R15, IO are predetermined, the modulation factor $M_A$ is proportional only to the amplitude A of the modulating signal. Therefore, the modulation factor $M_A$ indicates a high linearity to the amplitude of the modulating signal.

As described above, the amplitude modulator of this invention causes a modulating signal to be differentially amplified. Differential outputs are emitted in the summed form, thereby eliminating the leakage of a modulating signal, and enabling the amplitude-modulated component of a carrier signal to issue. The amplitude modulator of this invention, which does not employ a transformer, is well adapted for integration.

It will be noted that this invention is not limited to the foregoing embodiment, but is workable with various changes and modifications. The resistors R15, R16 are used to compensate for variations in the base-emitter voltage of the transistors Q8, Q9. When variations appear in the base-emitter voltage of the transistors Q8, Q9 and the offset appears between the base voltages of the transistors Q8, Q9, it prevents the collector current IO of the transistor Q10 from being divided into two exactly equal parts. As a result, some amount of a modulating signal remains in the modulated output Iout. If the voltage drops of the resistors R15, R16 are respectively larger than those of the base-emitter voltages of the transistors Q8, Q9, then variations in the base-emitter voltage are substantially reduced and produce no leakage. In the absence of the resistors R15, R16, the collector currents I1, I2 are expressed as follows:

$$I1 = IO/2 + (IO/2VT)A\cos\omega_1 t \quad (9)$$

$$I2 = IO/2 - (IO/2VT)A\cos\omega_1 t \quad (10)$$

Substitution of diodes for the resistors R15, R16 have the same effect as described above. Further, a current source may be formed simply of a resistor. The modulating signal may be supplied to the base of the transistor Q8. The modulated output may be emitted from one end of the resistor R7. It is also possible to supply a modulating signal as a differential input to the transistors Q8, Q9 and to draw out a modulated output in the form of a differential output from the resistors R6, R7 at one end.

What is claimed is:
1. An amplitude modulator, for producing an amplitude modulated signal that includes an amplitude-modulated component of a carrier signal, which comprises:
   a first differential pair of transistors, one of which is supplied with said carrier signal at a base thereof;

a second differential pair of transistors, one of which is also supplied with said carrier signal at a base thereof;

first and second resistors, with one end of said first resistor connected to the emitter of one of said first differential pair of transistors, one end of said second resistor connected to the emitter of the other one of said first differential pair of transistors, and with the other ends of said first and second resistors connected together at a node, said first and second resistors each having a higher resistance than the emitter resistance of each one of said first differential pair of transistors;

a third differential pair of transistors of which one transistor is supplied at a base thereof with a modulating signal, said third differential pair of transistors each having a collector, with one of said collectors coupled to said node of said first and second resistors and the other of said collectors coupled to a common connection of emitters of said second differential pair of transistors;

a current source coupled to said common connection of emitters of said third differential pair of transistors; and a load resistor connected both to the collector of one transistor in said first differential pair and to the collector of one transistor in said second differential pair.

2. An amplitude modulator according to claim 1 wherein said modulating signal comprises a differentially modulating signal supplied to the bases of both transistors of said third differential pair of transistors; and wherein two transistors, one from said first and one from said second differential pairs of transistors, have their collectors connected together and their bases connected together and have a differentially modulated output issued from said jointly connected together collectors.

3. An amplitude modulator according to claim 2 in which said load resistor is connected to the collectors of the two transistors in said first and second differential pair of transistors whose bases are connected to each other.

* * * * *

UNITED STATES PATENT AND TRADEMARK OFFICE
CERTIFICATE OF CORRECTION

PATENT NO. : 4,547,752
DATED : October 15, 1985
INVENTOR(S) : Seitaro Shinbara

It is certified that error appears in the above-identified patent and that said Letters Patent is hereby corrected as shown below:

Page 1, line [73] Assignee: change "Tokyo Shibaura Denki Kabushiki" to --Tokyo Shibaura Denki Kabushiki Kaisha-- and change "Kaisha, Japan" to --Kawasaki, Japan--; and line [30] In the Foreign Application Priority Data, change "58-53481" to --57-53481--.

Signed and Sealed this

Fifteenth Day of April 1986

[SEAL]

Attest:

DONALD J. QUIGG

*Attesting Officer*  *Commissioner of Patents and Trademarks*